US010911710B1

(12) United States Patent
Li et al.

(10) Patent No.: US 10,911,710 B1
(45) Date of Patent: Feb. 2, 2021

(54) OUTDOOR TELEVISION WITH WATERPROOF STRUCTURE

(71) Applicant: Keewin Display Co., Ltd., Shanghai (CN)

(72) Inventors: Wen Li, Shanghai (CN); Rubin Sun, Shanghai (CN); Wenliang Shen, Shanghai (CN)

(73) Assignee: Keewin Display Co., Ltd., Shanghai (CN)

( * ) Notice: Subject to any disclaimer, the term of this patent is extended or adjusted under 35 U.S.C. 154(b) by 0 days.

(21) Appl. No.: 16/845,638

(22) Filed: Apr. 10, 2020

(30) Foreign Application Priority Data

Oct. 11, 2019 (CN) .......................... 2019 1 0963625

(51) Int. Cl.
*H04N 5/64* (2006.01)
*H05K 5/06* (2006.01)
*G02F 1/1333* (2006.01)

(52) U.S. Cl.
CPC ......... *H04N 5/64* (2013.01); *G02F 1/133308* (2013.01); *H05K 5/065* (2013.01); *G02F 2001/133311* (2013.01); *G02F 2202/28* (2013.01)

(58) Field of Classification Search
None
See application file for complete search history.

(56) References Cited

U.S. PATENT DOCUMENTS

| 2015/0253612 A1* | 9/2015 | Hasegawa | G02F 1/133308 349/58 |
| 2017/0105304 A1* | 4/2017 | Yu | G06F 1/1628 |
| 2019/0350099 A1* | 11/2019 | Ren | G06F 3/1446 |

FOREIGN PATENT DOCUMENTS

| WO | WO 2018/119887 | * | 7/2018 |
| WO | WO 2018/119888 | * | 7/2018 |

* cited by examiner

*Primary Examiner* — Ryan Crockett
(74) *Attorney, Agent, or Firm* — Wang Law Firm, Inc.

(57) ABSTRACT

The present invention relates to an outdoor television with a waterproof structure, comprising: a display module, a control component of the display module and a cover body covering outside the display module and the control component, the control component being located in an upper position of the outdoor television, and the top of the cover body covering the top of the display module. According to the present invention, the top of the cover body covers the top of the display module, so that a seam is not left in the top of the outdoor television, and rainwater is prevented from permeating from the top of the outdoor television, effectively playing a role of waterproofing. Compared with existing televisions that a control component is disposed at a lower portion of a television, a mode that a control component is disposed in an upper position of an outdoor television can avoid a situation that the control component is soaked in stagnant water when the stagnant water exists in a television, so as to avoid influence of invading rainwater to functions of the control component, and ensure the service life of the outdoor television.

9 Claims, 9 Drawing Sheets

OUTDOOR TELEVISION WITH WATERPROOF STRUCTURE

BACKGROUND

Technical Field

The present invention relates to the technical field of televisions, in particular, to an outdoor television with a waterproof structure.

Related Art

A television is equipment for transmitting active images and pictures as well as audio signals by utilizing electronic technology and equipment, and belongs to necessities in family life. The television is usually placed in a living room or a bedroom, and is prevented from wind and rain due to good indoor environment, and therefore, existing televisions do not need a waterproof function.

However, along with constant increase of requirements of people, a television expected to be used outdoors is proposed, that is, an outdoor television. It is different from current so-called outdoor televisions in the field of televisions, and the so-called outdoor televisions in the field of televisions refer to elevator television, store television and office-building television. However, these televisions are still used in an indoor environment, and cannot be directly used outdoors, because outdoor environments are harsh, and situations such as wind and rain often occur. If an existing LCD television is directly used outdoors, rainwater will permeate into the television, greatly shortening the service life of the television. In prior art, common outdoor display equipment is an outdoor advertising machine. However, the outdoor advertising machine or outdoor display equipment belongs to a technical field different from televisions. The outdoor advertising machine or outdoor display equipment is a kind of commercial product, and has extremely high requirements for the dustproof and waterproof, anti-corrosion, brightness and heat dissipation functions of a product, and therefore the price of the outdoor advertising machine or outdoor display equipment is far higher than that of televisions. Although the outdoor advertising machine or outdoor display equipment can be used in a harsh outdoor environment, it cannot meet the requirements of family life in functions, and is not applicable to families due to a high price.

For this reason, there is an urgent need to provide a television that can be used outdoors by people.

SUMMARY

The present invention is directed to overcome defects of the prior art, and provides an outdoor television with a waterproof structure, solving the problem that an existing television is greatly shortened in the service life due to permeation of rainwater when being used outdoors.

A technical scheme for achieving the foregoing purpose is as follows:

The present invention provides the outdoor television with a waterproof structure, including: a display module, a control component of the display module and a cover body covering outside the display module and the control component, the control component being located at an upper portion of the outdoor television, and the top of the cover body covering the top of the display module.

According to the present invention, the top of the cover body covers the top of the display module, so that a seam is not left in the top of the outdoor television, and rainwater is prevented from permeating from the top of the outdoor television, effectively playing a role of waterproofing. Compared with existing televisions that a control component is disposed at a lower portion of a television, a mode that a control component is disposed in an upper position of an outdoor television can avoid a situation that the control component is soaked in stagnant water when the stagnant water exists in the television, so as to avoid influence of invading rainwater to functions of the control component, and ensure the service life of the outdoor television. The control component is moved up, and all those located at a lower portion of the outdoor television are structural parts, so that even if rainwater enters the outdoor television, the rainwater is accumulated at the bottom of the outdoor television, and cannot damage the structural parts at the lower portion of the outdoor television, avoiding influence on the service life of the outdoor television. The control component is covered in the cover body, and the cover body avoids contact of the control component with rainwater, so as to play a good role of waterproofing.

Further improvement of the outdoor television with a waterproof structure in the present invention lies in that the cover body includes a first cover plate, a second cover plate and an integrated frame;

the second cover plate covers on a rear portion of the display module;

the first cover plate covers on upper portions of the display module and the second cover plate, and the top of the first cover plate covers the top of the display module and is in airtight connection with a front edge of the display module, and butt jointed portions of the first cover plate and the second cover plate are in airtight connection; and the integrated frame is nested at the bottom and the side portion of the display module, and the integrated frame is in airtight connection with the corresponding first cover plate and the edge of the display module.

Further improvement of the outdoor television with a waterproof structure lies in that the display module includes an LCD panel, and the LCD panel is connected with the control component; and the control component is disposed at a rear portion of the display module and located in the first cover plate.

Further improvement of the outdoor television with a waterproof structure lies in that an inclined bearing plane is disposed on the top of the second cover plate; and the control component is disposed on the bearing plane.

Further improvement of the outdoor television with a waterproof structure lies in that the display module also includes electrical apparatus elements, the electrical apparatus elements being disposed in the first cover plate.

Further improvement of the outdoor television with a waterproof structure lies in that a mounting plane vertical to the second cover plate is formed at the bottom of the first cover plate, and an interface connected with the display module is formed in the mounting plane.

Further improvement of the outdoor television with a waterproof structure lies in that a stripe hole is formed in the mounting plane; and an operating port is formed in a position, corresponding to the stripe hole, of the first cover plate, and a sealing cover is detachably connected to the operating port.

Further improvement of the outdoor television with a waterproof structure lies in that the top edge of the first cover plate bends downwards to form an edgefold, and a first waterproof adhesive tape for sealing a joint of the edgefold and the display module is pasted on an inner surface of the edgefold.

Further improvement of the outdoor television with a waterproof structure lies in that a fitting edge is disposed on a side portion, corresponding to the integrated frame, of the first cover plate, and the fitting edge fits to the integrated frame and is connected with a second waterproof adhesive tape in a clamping mode.

Further improvement of the outdoor television with a waterproof structure lies in that a third waterproof adhesive tape is disposed at a joint of the integrated frame and the display module.

DETAILED DESCRIPTION

The present invention will be further described below with reference to the accompanying drawings and specific embodiments.

Figure 1:
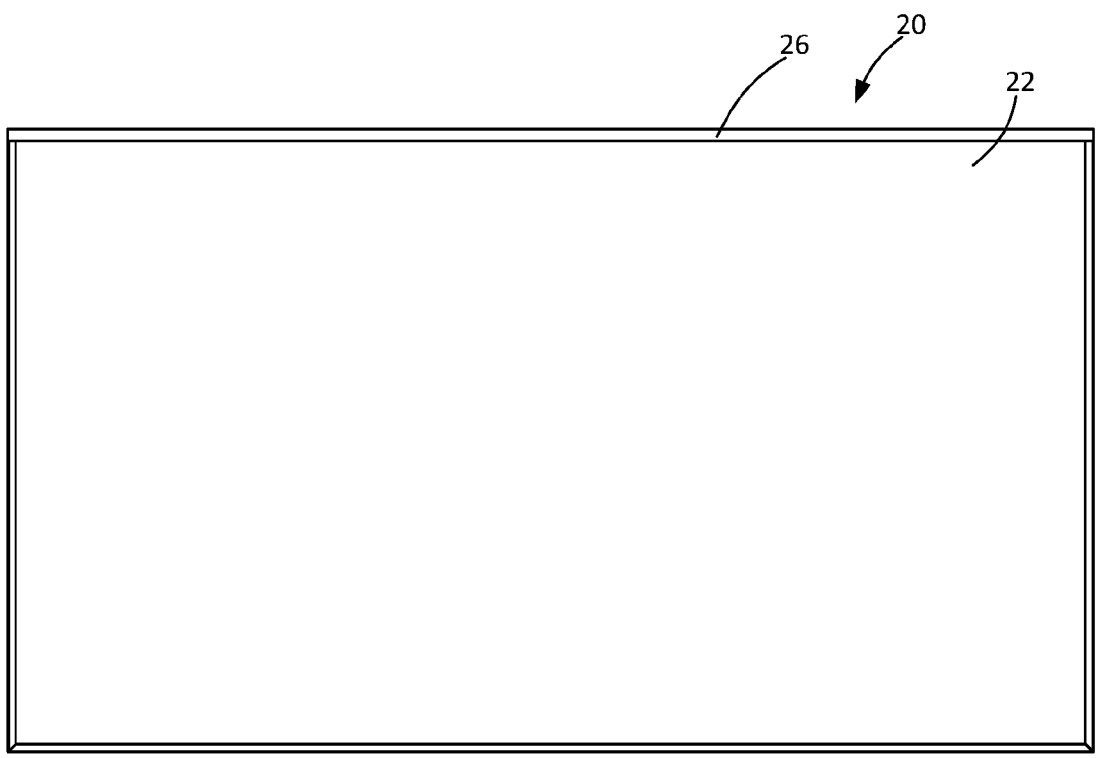
FIG. 1 is a front view of an outdoor television with a waterproof structure of the present invention.

Referring to FIG. 1, the present invention provides an outdoor television with a waterproof structure, for meeting the requirement of people for using a television outdoors. As for the outdoor television, compared with existing televisions, it is designed that the top of a cover body covers the top of a display module, so that a seam is not left in the top of the outdoor television, to ensure that rainwater cannot permeate from the top of the outdoor television. Moreover, a control component is moved up, that is, a control component is disposed at an upper portion of the outdoor television, which also plays a role of waterproofing and avoids contact of the control component with rainwater invading into the outdoor television. If rainwater invades into the outdoor television, the invading rainwater will be accumulated at the bottom of the outdoor television. In this way, after the control component is moved up, the control component cannot be soaked in stagnant water, so as to ensure normal operation of the control component and ensure the service life of the outdoor television. The control component includes a COF connected with an LCD panel of the outdoor television and a PCB connected with the COF, and the COF and the PCB are moved to the top of the outdoor television and are covered by the cover body to achieve a waterproof effect. The following describes a structure of the outdoor television with a waterproof structure of the present invention with reference to drawings.

Figure 5:
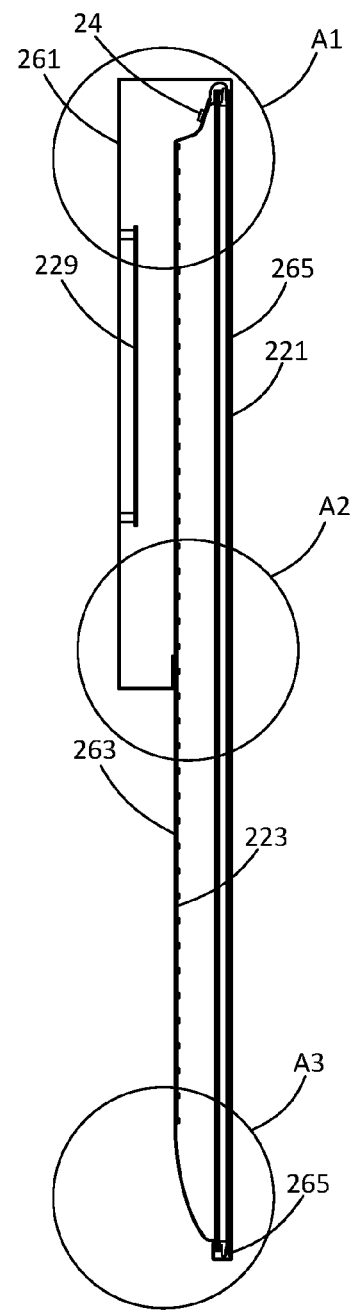
FIG. 5 is a side sectional view of an outdoor television with a waterproof structure of the present invention.

Referring to FIG. 1, it shows a front view of an outdoor television with a waterproof structure of the present invention. Referring to FIG. 5, it shows a side sectional view of an outdoor television with a waterproof structure of the present invention. The following describes a structure of the outdoor television with a waterproof structure of the present invention with reference to FIG. 1 and FIG. 5.

As shown in FIG. 1 and FIG. 5, an outdoor television 20 with a waterproof structure includes a display module 22, a control component 24 of the display module 22 and a cover body 26 covering outside the display module 22 and the control component 24, the control component 24 is located at an upper portion of the outdoor television 20, and the top of the cover body 26 covers the top of the display module 22.

Preferably, a portion, covering the top of the display module 22, of the cover body 26 is of an integrated structure, that is, there is no seam in the integrated structure. Because the integrated structure covers the top of the display module 22, when the outdoor television 20 is used outdoors and encounters rain, rainwater cannot invade from the top of the outdoor television 20 and flows downwards along the integrated structure at the top of the outdoor television 20, so that rainwater is prevented from invading the outdoor television 20 from the top, so as to effectively protect the outdoor television 20 and play a role of waterproofing. Further, the control component 24 is disposed at an upper portion of the outdoor television 20, which also plays a role of waterproofing. As a result, when water invades into the outdoor television 20 to form stagnant water, the stagnant water is located at the lower portion of the outdoor television 20, while the control component 24 is located at the upper portion of the outdoor television 20, so that the control component 24 cannot be soaked in the stagnant water. Contact of the control component 24 with water is effectively avoided, and the control component 24 is protected, thereby ensuring that the outdoor television 20 can be normally used in a harsh outdoor environment, and prolonging the service life of the outdoor television 20.

Figure 2:
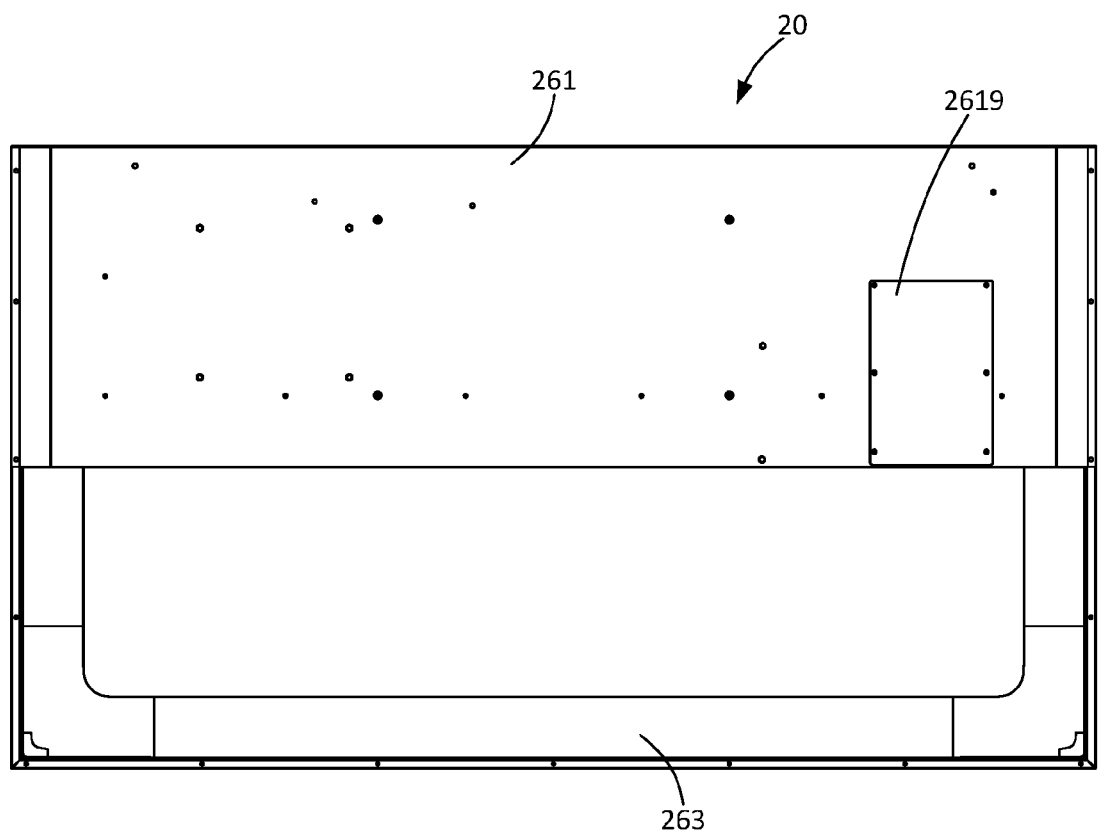
FIG. 2 is a rear view of an outdoor television with a waterproof structure of the present invention.
Figure 4:
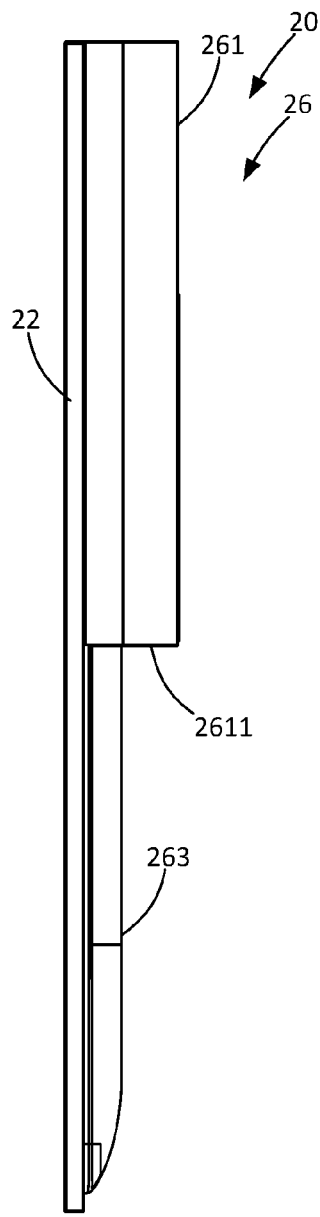
FIG. 4 is a side view of an outdoor television with a waterproof structure of the present invention.

In a specific implementation, as shown in FIG. 2 and FIG. 4, an upper protruding portion at the rear portion of the outdoor television 20 is a placing position of the control component 24, while a control component of an existing television is placed at the lower portion of the rear portion of the television, so as to ensure the placing stability of the television and avoid tilting of the television. While the control component 24 of the outdoor television 20 of the present invention is placed at an upper portion, so that when the outdoor television 20 is fixed, a hanging mode may be adopted, that is, the outdoor television 20 is hung and fixed at a higher position, and other mounting modes such as clamping may be also adopted.

In a specific implementation, as shown in FIG. 2, FIG. 5, FIG. 7 to FIG. 9, the cover body 26 includes a first cover plate 261, a second cover plate 263 and an integrated frame 265. The second cover plate 263 covers on a rear portion of the display module 22, the first cover plate 261 covers on upper portions of the display module 22 and the second cover plate 263, and the top of the first cover plate 261 covers the top of the display module 22 and is in airtight connection with a front edge of the display module 22. Butt jointed portions of the first cover plate 261 and the second cover plate 263 are in airtight connection. The integrated frame 265 is nested at the bottom and the side portion of the display module 22, and the integrated frame 265 is in airtight connection with the corresponding first cover plate 261 and the edge of the display module 22. Preferably, the first cover plate 261 is of an integrated structure, and the second cover plate 263 is also of an integrated structure.

According to the present invention, the first cover plate 261, the second cover plate 263 and the integrated frame 265 are in airtight connection with the display module 22, and portions except the front portion of the display module 22 are sealed and covered, so as to avoid invasion of rainwater, which plays an effective role of waterproofing for the display module 22. The front portion of the display module 22 refers to a portion for displaying pictures.

Figure 7:
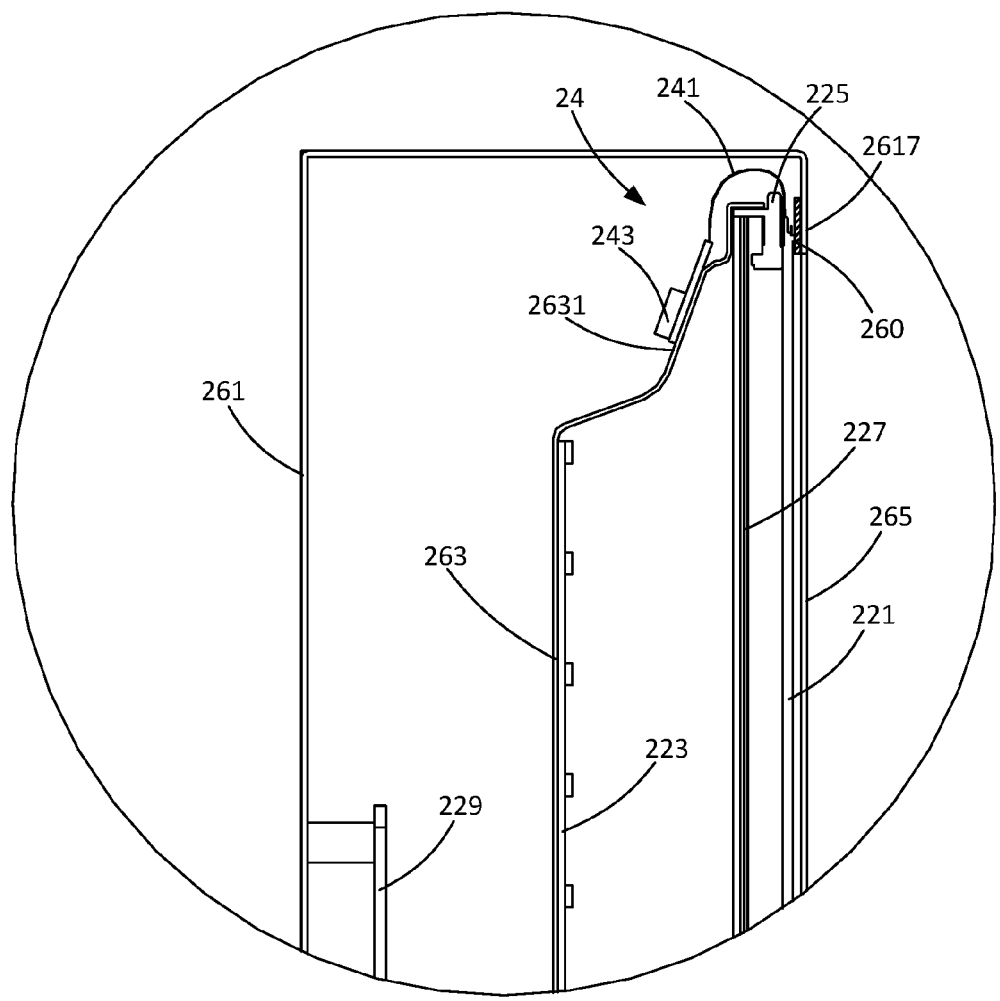
FIG. 7 is a schematic locally amplified structure view of A1 in FIG. 5.

In a specific implementation, as shown in FIG. 7, the display module 22 includes an LCD panel 221, and the LCD panel 221 is connected with the control component 24; the control component 24 is disposed at the rear portion of the display module 22 and located in the first cover plate 261. The control component 24 is configured to control display of pictures of the LCD panel 221. According to the present invention, the first cover plate 261 covers the control component 24, so as to play a role of waterproofing for the control component 24.

Preferably, an inclined bearing plane 2631 is disposed on the top of the second cover plate 263, and the control component 24 is disposed on the bearing plane 2631. The bearing plane 2631 is configured to bear and fix the control component 24, so as to provide a steady and reliable fixing foundation for the control component 24, and in match with covering of the first cover plate 261, the control component 24 has a good waterproof effect.

Further, the control component 24 includes a PCB243 (Printed Circuit Board) and a COF241 (Chip On Flex or Chip On Film), the COF241 is connected with the PCB243, and the COF241 includes a flat cable and a chip disposed on the flat cable. Preferably, the flat cable of the COF241 stretches out from the top of the LCD panel 221 and bypasses the top of the display module 22, and the PCB243 is placed on the bearing plane 2631 at the top of the second cover plate 263.

In a specific implementation, as shown in FIG. 5 and FIG. 7, the display module 22 also includes electrical apparatus elements 229, and the electrical apparatus elements 229 are placed in the first cover plate 261. Preferably, the first cover plate 261 has a vertical portion opposite to the rear portion of the display module 22, and the electrical apparatus elements 229 are fixed on the vertical portion. More preferably, the electrical apparatus elements 229 are a power source and a driving board, and the power source and the driving board are connected with the display module 22.

Figure 3:
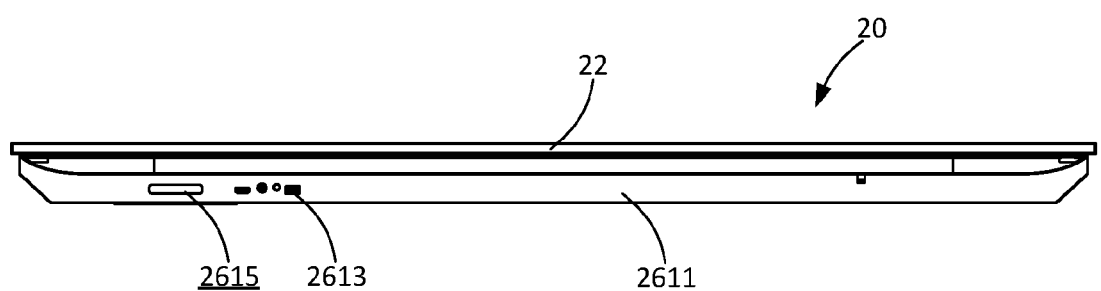
FIG. 3 is a top view of an outdoor television with a waterproof structure of the present invention.

In a specific implementation, as shown in FIG. 3 to FIG. 5, a mounting plane 2611 vertical to the second cover plate 263 is formed at the bottom of the first cover plate 261, an interface 2613 for connecting with the display module 22 is formed in the mounting plane 2611, and the interface 2613 is connected with the electrical apparatus elements 229.

Figure 6:
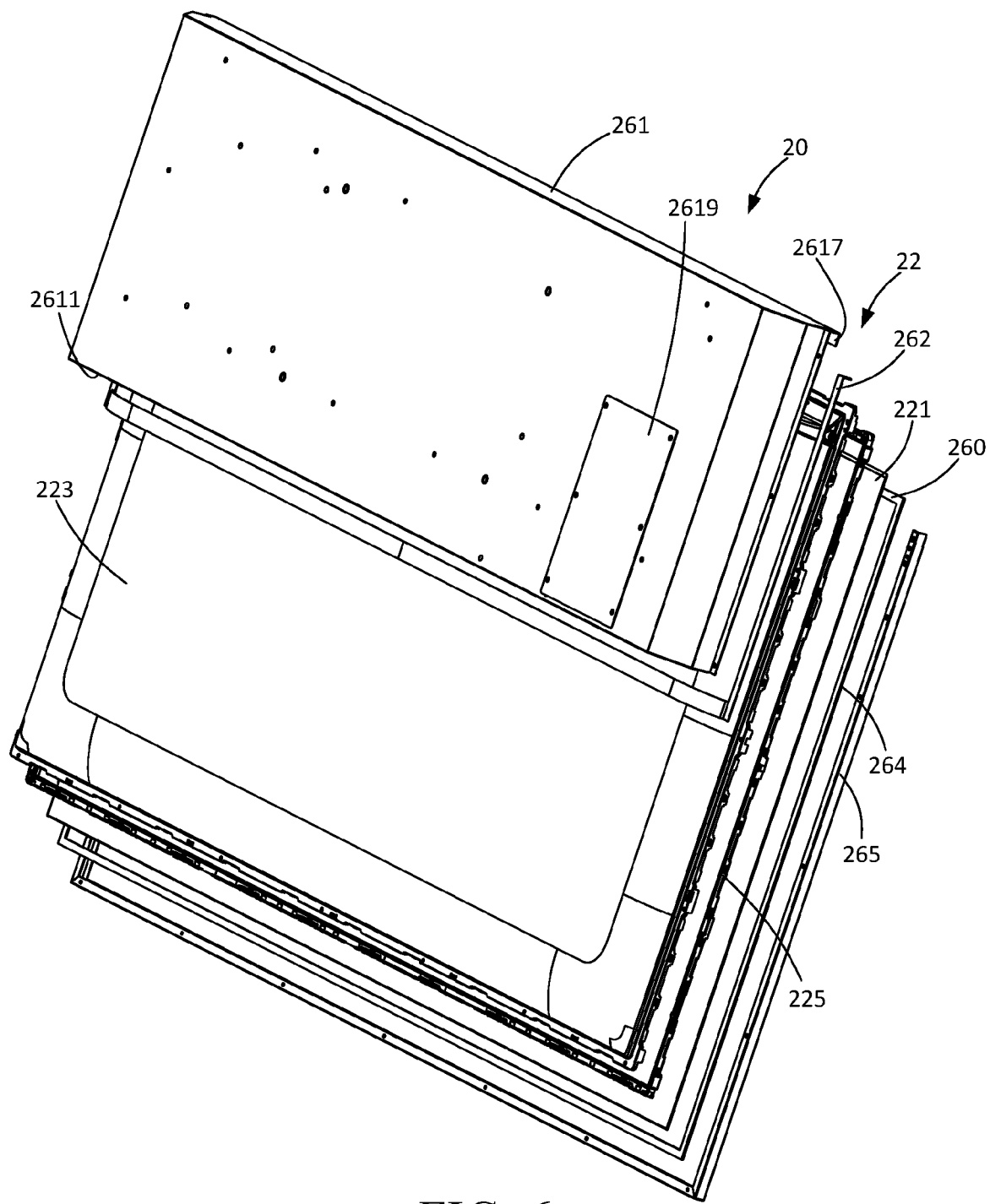
FIG. 6 is a schematic explosive breakdown structure view of an outdoor television with a waterproof structure of the present invention.

Further, a stripe hole 2615 is formed in the mounting plane 2611 of the first cover plate 261, as shown in FIG. 2 and FIG. 6, an operating port is formed in a position, corresponding to the stripe hole 2615, of the first cover plate 261, and a sealing cover 2619 is detachably connected to the operating port. The stripe hole 2615 provides an expansion interface for the display module 22, so that when equipment with a non-standard interface needs to be accessed to the outdoor television, the sealing cover 2619 may be dismounted. Then a connecting wire of the equipment with a non-standard interface is penetrated through the stripe hole 2615 and connected with the electrical apparatus elements 229 via the operating port, and then the sealing cover 2619 is covered on the operating port and is connected and fixed with the first cover plate 261.

Figure 8:
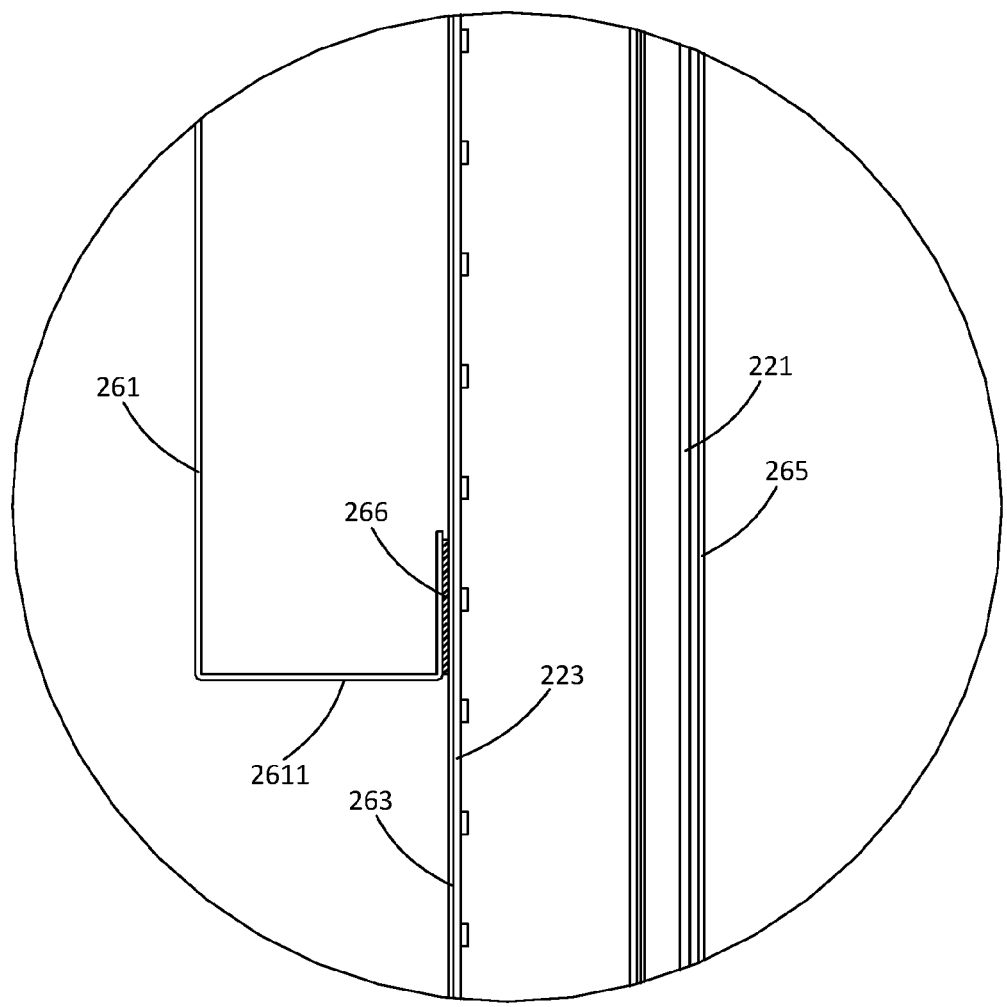
FIG. 8 is a schematic locally amplified structure view of A2 in FIG. 5.

The interface 2613 is designed on the mounting plane 2611 formed at the bottom of the first cover plate 261, as shown in FIG. 5 and FIG. 8, the interface 2613 is set downwards and not exposed, so as to prevent rainwater from invading into the interface 2613 or invading into the outdoor television 20 from the interface 2613. Moreover, the interface 2613 is disposed on the mounting plane 2611 by being hidden, so that the appearance of the outdoor television 20 is more attractive.

In a specific implementation, as shown in FIG. 6 and FIG. 7, the top edge of the first cover plate 261 bends downwards to form an edgefold 2617, and a first waterproof adhesive tape 260 for sealing a joint of the edgefold 2617 and the display module 22 is pasted on an inner surface of the edgefold 2617. The first waterproof adhesive tape 260 plays a role of sealing and waterproofing.

Preferably, the first waterproof adhesive tape 260 is clamped between the edgefold 2617 and the LCD panel 221, for sealing a joint of the upper portion of the LCD panel 221 and the edgefold 2617.

Figure 10:
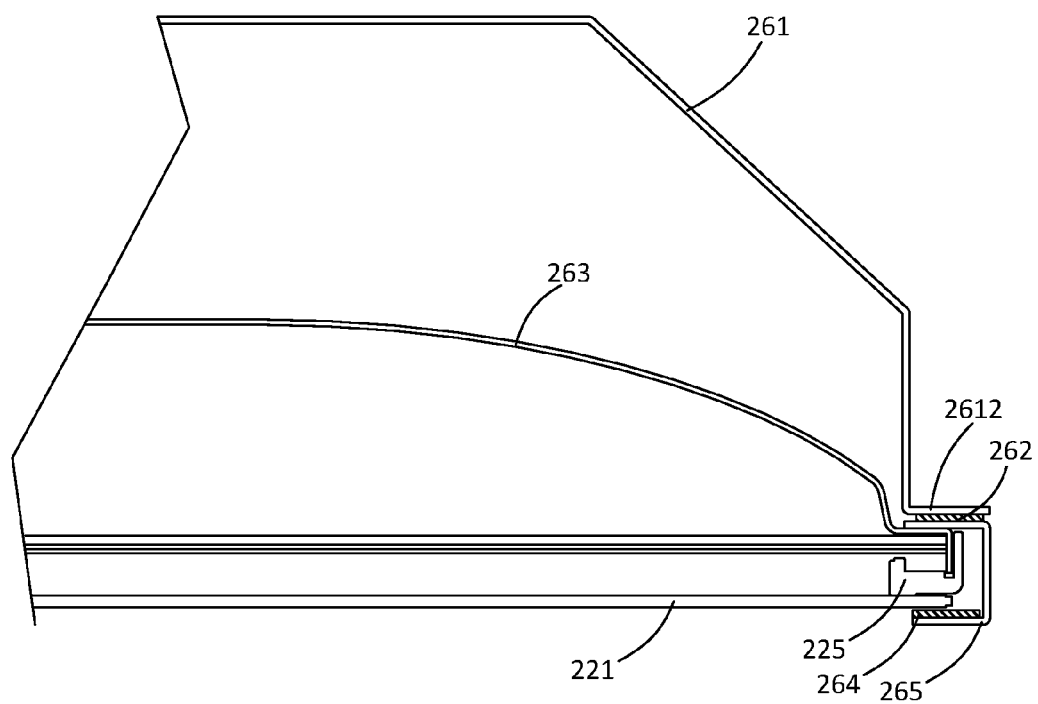
FIG. 10 is a schematic amplified structure view of a lateral section-view lower end portion of an outdoor television with a waterproof structure of the present invention.

Further, as shown in FIG. 10, a fitting edge 2612 is disposed on a side portion, corresponding to the integrated frame 265, of the first cover plate 261, and the fitting edge 2612 fits to the integrated frame 265 and is connected with a second waterproof adhesive tape 262 in a clamping mode.

More preferably, as shown in FIG. 5, the first cover plate 261 includes a vertical portion opposite to the second cover plate 263, the top of the vertical portion vertically bends to form a horizontal portion parallel to the top of the display module 22, the horizontal portion is located above the top of the display module 22, furthermore, the end portion of the horizontal portion bends to form the edgefold 2617, and the edgefold 2617 realizes waterproofing and sealing via the first waterproof adhesive tape 260. As shown in FIG. 8, the bottom of the vertical portion vertically bends to form the mounting plane 2611, the end portion of the mounting plane 2611 bends upwards to form a connecting portion, and a fourth waterproof adhesive tape 266 is disposed between the connecting portion and the second cover plate 263. As shown in FIG. 10, two sides of the vertical portion of the first cover plate 261 are bent slantly and then are bent vertically to cover corresponding side portions of the second cover plate 263, and further are bent horizontally to form the fitting edge 2612, and the fitting edge 2612 realizes waterproofing and sealing via the second waterproof adhesive tape 262. Therefore, all joints of the first cover plate 261 are sealed by the first waterproof adhesive tape 260, the second waterproof adhesive tape 262 and the fourth waterproof adhesive tape 266, so that the first cover plate 261 covers on the display module 22 by sealing. It is ensured that the control component 24 and the electrical apparatus elements 229 in the first cover plate 261 are located in an airtight space, and a good waterproof effect is achieved.

Figure 11:
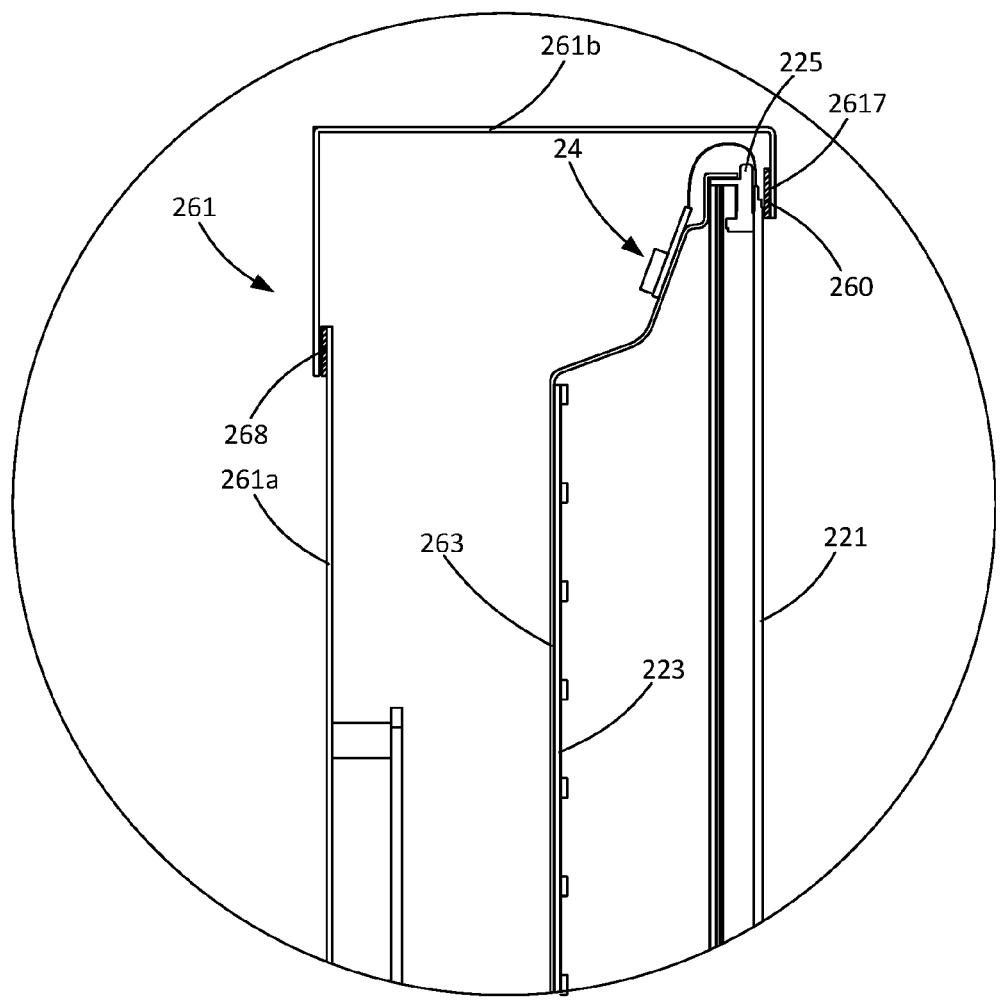
FIG. 11 is a schematic top locally amplified structure view of another preferred embodiment of a first cover plate of an outdoor television with a waterproof structure of the present invention in a side sectional view.

In a specific implementation, as shown in FIG. 11, the first cover plate 261 adopts a split structure. The first cover plate 261 includes a first portion 261*a* and a second portion 261*b*. The second portion 261*b* is covered on the tops of the display module 22 and the second cover plate 263. An end side of the second portion 261*b* is in airtight connection with the LCD panel 221 by the first waterproof adhesive tape 260.

The first portion 261a covers on rear portions of the display module 22 and the second cover plate 263. One side of the first portion 261a is in airtight connection with the second cover plate 263 by the fourth waterproof adhesive tape 266. The first portion 261a is connected with a corresponding end portion of the second portion 261b, and a sealant 268 is disposed at the joint to realize sealing and waterproofing. The first cover plate 261 is segmented into the first portion 261a and the second portion 261b, so as to be convenient for assembly-line mounting, and increase the outdoor television assembling efficiency under the condition of meeting the waterproof requirement.

Figure 9:
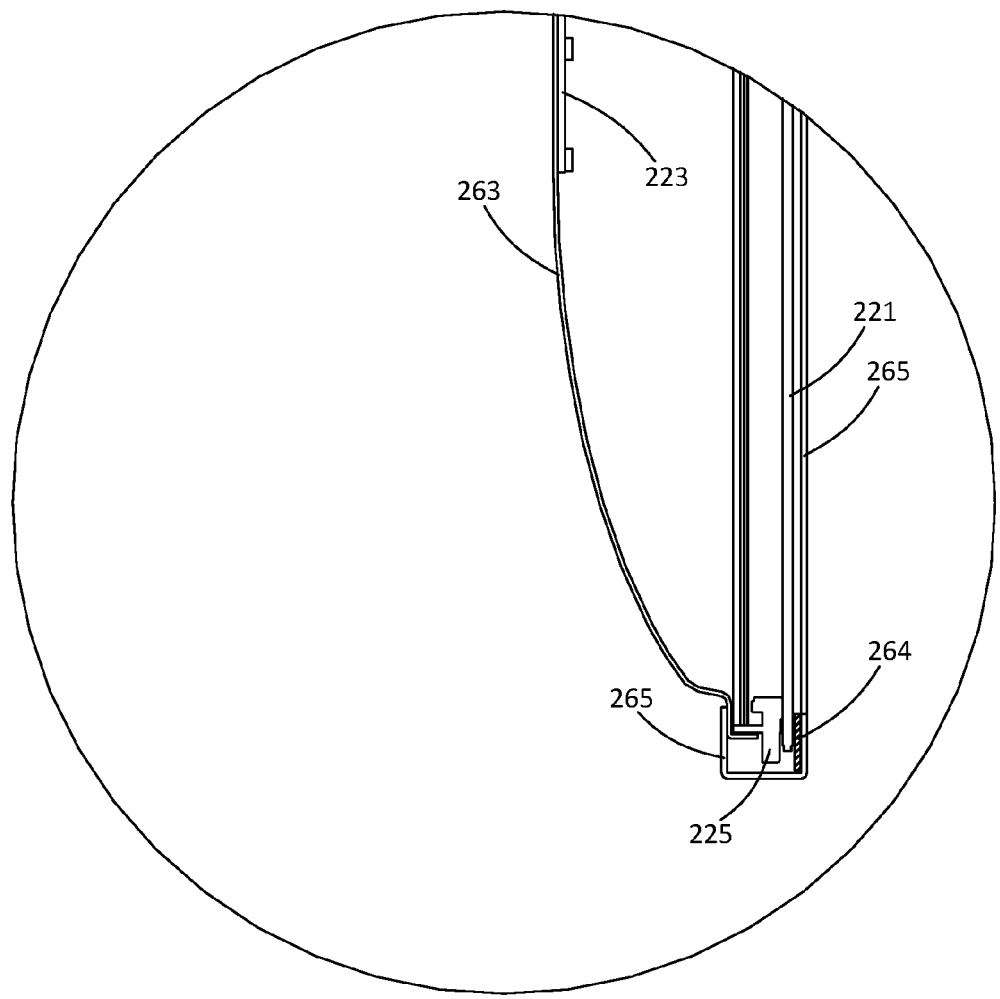
FIG. 9 is a schematic locally amplified structure view of A3 in FIG. 5.

In a specific implementation, as shown in FIG. 9, a third waterproof adhesive tape 264 is disposed at a joint of the integrated frame 265 and the display module 22.

Preferably, the section of the integrated frame 265 is of U shape, including a bottom frame plate and two side frame plates vertically connected with the bottom frame plate. The U-shaped frame is nested to the bottom and the side portion of the display module 22 via an opening between the two side frame plates. The third waterproof adhesive tape 264 is pasted on the inner surface of the side frame plate. The third waterproof adhesive tape 264 is used for sealing joints of the side frame plates and the display module 22.

As shown in FIG. 6, the third waterproof adhesive tape 264 is disposed between side frame plates of the U-shaped frame and the LCD panel 221. The third waterproof adhesive tape 264 is connected with the first waterproof adhesive tape 260, so that a closed sealing and waterproof structure is formed at the periphery of the LCD panel 221, and the periphery of an outer surface of the LCD panel 221 is airtight and waterproof, thus realizing front waterproofing of the outdoor television 20.

In a specific implementation, as shown in FIG. 5 to FIG. 9, the display module 22 also includes a back plate 223, a plastic frame 225 and a diaphragm 227. The plastic frame 225 is configured to mount and fix the LCD panel 221 and the diaphragm 227. A light bar is disposed on the back plate 223. The back plate 223 is fixed on the second cover plate 263. The diaphragm 227 is placed between the back plate 223 and the LCD panel 221. Preferably, as shown in FIG. 7 and FIG. 9, clamping faces are disposed at the top and bottom of the plastic frame 225, clamping edges are correspondingly formed at the top and bottom of the second cover plate 263, and the clamping edges are buckled on the corresponding clamping faces, so that the second cover plate 263 covers on the back of the display module 22 and is in clamped connection with the plastic frame 225. As shown in FIG. 10, side plates are disposed at two side portions of the plastic frame 225. After the diaphragm 227 is mounted, plugging slots are formed between the two side portions of the diaphragm 227 and the corresponding side plates. Plugging edges are disposed at corresponding side portions of the second cover plate 263. The plugging edges are plugged into the corresponding plugging slots.

The dimension of the second cover plate 263 is adapted to that of the display module 22, and the second cover plate 263 covers on the rear portion of the display module 22 and completely covers the rear portion of the display module 22. The second cover plate 263 is in clamped connection with the plastic frame 225.

Preferably, the first cover plate 261, the second cover plate 263 and the integrated frame 265 are steel plates.

The present invention is described above in detail with reference to the embodiments of the accompanying drawings, and a person of ordinary skill in the art may make various modifications to the present invention according to the above description. Therefore, some details in the embodiments shall not constitute a limitation on the present invention, and the protection scope of the present invention shall be subject to the scope of the appended claims.

What is claimed is:

1. An outdoor television with a waterproof structure, comprising:
   a display module, a control component of the display module and a cover body covering outside the display module and the control component, the control component being located in an upper position of the outdoor television, and the top of the cover body covering the top of the display module;
   wherein the cover body comprises a first cover plate, a second cover plate and an integrated frame;
   the second cover plate covers on a rear portion of the display module;
   the first cover plate covers on upper portions of the display module and the second cover plate, the top of the first cover plate covers the top of the display module and is in airtight connection with a front edge of the display module, and butt jointed portions of the first cover plate and the second cover plate are in airtight connection; and
   the integrated frame is nested at the bottom and the side portion of the display module, and the integrated frame is in airtight connection with the corresponding first cover plate and the edge of the display module.

2. The outdoor television with a waterproof structure according to claim 1, wherein the display module comprises an LCD panel, and the LCD panel is connected with the control component; and
   the control component is disposed at a rear portion of the display module and located in the first cover plate.

3. The outdoor television with a waterproof structure according to claim 2, wherein an inclined bearing plane is disposed on the top of the second cover plate; and
   the control component is disposed on the bearing plane.

4. The outdoor television with a waterproof structure according to claim 1, wherein the display module also comprises electrical apparatus elements, the electrical apparatus elements being disposed in the first cover plate.

5. The outdoor television with a waterproof structure according to claim 1, wherein a mounting plane vertical to the second cover plate is formed at the bottom of the first cover plate, and an interface connected with the display module is formed in the mounting plane.

6. The outdoor television with a waterproof structure according to claim 5, wherein a stripe hole is formed in the mounting plane; and
   an operating port is formed in a position, corresponding to the stripe hole, of the first cover plate, and a sealing cover is detachably connected to the operating port.

7. The outdoor television with a waterproof structure according to claim 1, wherein the top edge of the first cover plate bends downwards to form an edgefold, and a first waterproof adhesive tape for sealing a joint of the edgefold and the display module is pasted on an inner surface of the edgefold.

8. The outdoor television with a waterproof structure according to claim 1, wherein a fitting edge is disposed on a side portion, corresponding to the integrated frame, of the first cover plate, and the fitting edge fits to the integrated frame and is connected with a second waterproof adhesive tape in a clamping mode.

9. The outdoor television with a waterproof structure according to claim 1, wherein a third waterproof adhesive tape is disposed at a joint of the integrated frame and the display module.

* * * * *